United States Patent
Hamre

(10) Patent No.: US 6,671,316 B1
(45) Date of Patent: Dec. 30, 2003

(54) THREE STATE PULSE WIDTH MODULATION CODE

(75) Inventor: John David Hamre, Plymouth, MN (US)

(73) Assignee: Storage Technology Corporation, Louisville, CO (US)

(*) Notice: Subject to any disclaimer, the term of this patent is extended or adjusted under 35 U.S.C. 154(b) by 0 days.

(21) Appl. No.: 09/548,768

(22) Filed: Apr. 13, 2000

(51) Int. Cl.[7] .............................. H04L 27/04; H03D 3/24
(52) U.S. Cl. ...................... 375/239; 375/242; 375/295; 331/1 A
(58) Field of Search ................................ 375/239, 295, 375/350, 260, 242; 331/1 A; 341/158; 714/799, 719; 710/22

(56) References Cited

U.S. PATENT DOCUMENTS

| | | | | |
|---|---|---|---|---|
| 4,594,563 A | * | 6/1986 | Williams | 331/1 A |
| 4,811,361 A | * | 3/1989 | Bacou et al. | 375/242 |
| 5,659,585 A | * | 8/1997 | Meyer | 375/350 |
| 5,694,428 A | * | 12/1997 | Campana, Jr. | 375/260 |
| 5,990,716 A | * | 11/1999 | Chen | 327/172 |
| 6,198,777 B1 | * | 3/2001 | Feher | 375/295 |

* cited by examiner

Primary Examiner—Stephen Chin
Assistant Examiner—Edith Chang
(74) Attorney, Agent, or Firm—Brooks Kushman P.C.

(57) ABSTRACT

A DC balanced, single bit manipulation method and system for encoding a serial data stream having a plurality of low and high bits includes generating a pulse stream. The serial data stream is to be transferred along a serial loop. The pulse stream includes a series of pulses each having a nominal time duration. A pulse of the pulse stream is modified to have a time duration longer than the nominal time duration to encode a transition of the data stream from a low bit to a high bit. A pulse of the pulse stream is modified to have a time duration shorter than the nominal time duration to encode a transition of the data stream from a high bit to a low bit. The time duration of a pulse of the pulse stream is maintained at the nominal time duration to encode two sequential high bits of the data stream. The time duration of a pulse of the pulse stream is maintained at the nominal time duration to encode two sequential low bits of the data stream. A feature of the DC balanced, single bit manipulation method and system is that it is self clocking.

10 Claims, 3 Drawing Sheets

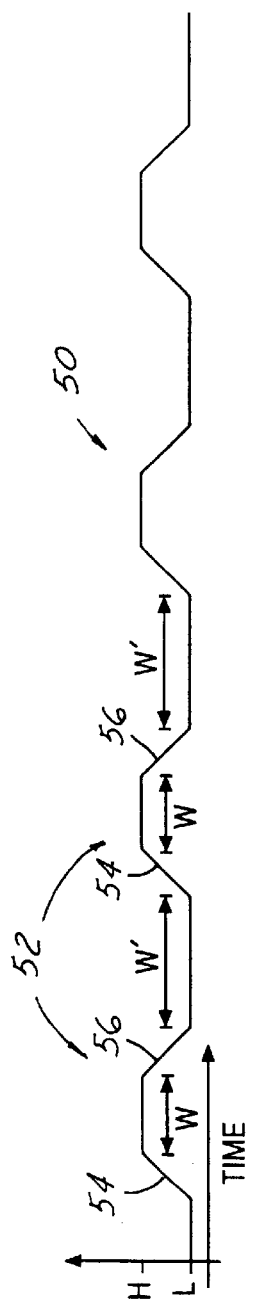
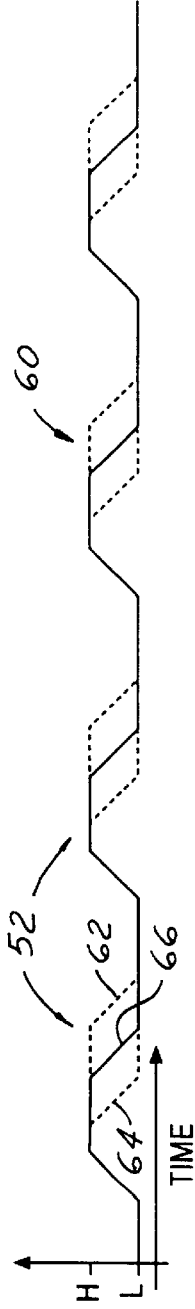
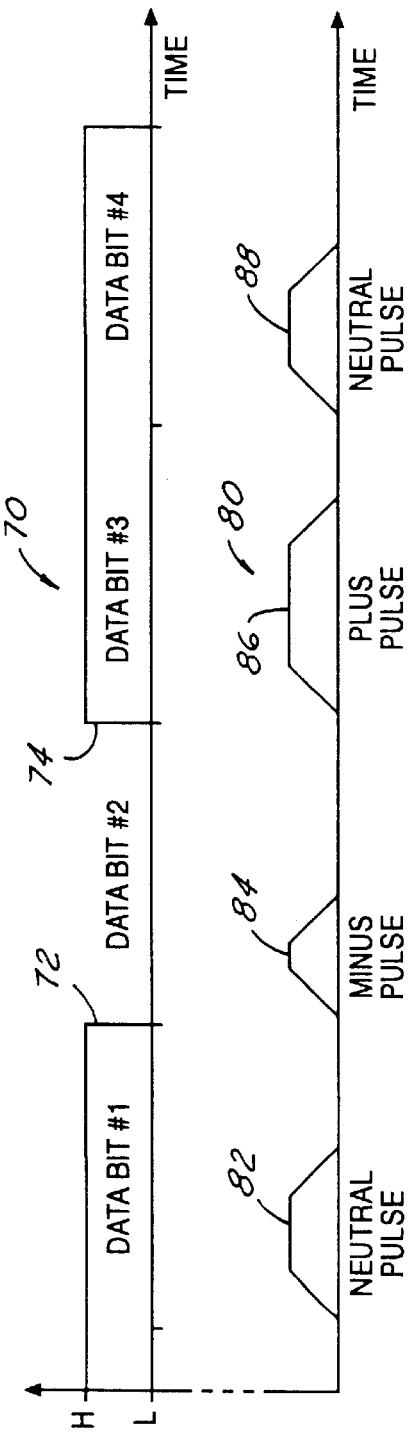
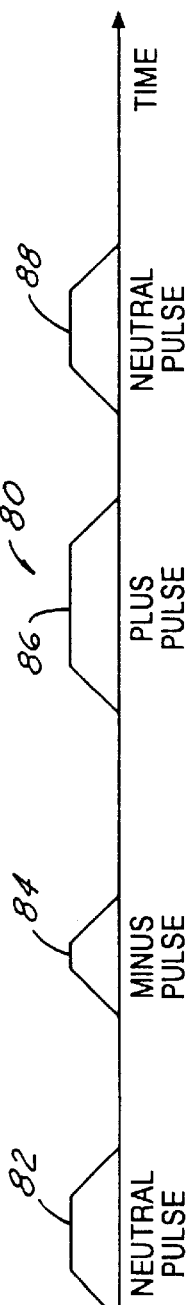
FIG. 2A
FIG. 2B
FIG. 3A
FIG. 3B

THREE STATE PULSE WIDTH MODULATION CODE

TECHNICAL FIELD

The present invention relates generally to DC balanced encoding methods and systems for serial data streams and, more particularly, to a DC balanced single bit manipulation encoding method and system for serial data streams.

BACKGROUND ART

Serial interconnect has become the industry standard for systems having large bandwidth requirements. Serial interconnect has been chosen over shared bus architectures in many cases because of the scalability, physical reach, pin efficiency, and flexibility associated with serial interconnect. Unfortunately, some of the desirable characteristics of shared bus, such as low latency, are lost when using serial interconnect in place of shared bus.

In order to provide the lowest possible latency, it is advantageous to keep the size of a data word as short as possible. When considering the latency of a serial data connection a number of factors are taken into account. The length of the data word is one factor.

The 8b/10b coding scheme used in fibre channel, Gigabit Ethernet, and other communication schemes uses 8 bits of data which are translated to 10 bits of code resulting in a 10 bit data word. The extra 2 bits of code enable the 8b/10b code to be DC balanced. Because the data word is the least number of bits that can be recognized/decoded, a receiver waits until all of the bits for a particular data word are received before the receiver can react to the data. Consequently, latency is proportional to the flight time and the amount of time needed to receive the data word. In the situation where one bit of information is useful to transmit, such as in control functions, a code that could provide single bit data words (single bit manipulation) will also provide minimal latency.

Generally, it is desirable to have a DC balanced coding scheme for serial data transmission. A DC balanced coding scheme has a constant DC value which allows the transmitter and the receiver to not be DC coupled.

SUMMARY OF THE INVENTION

Accordingly, it is an object of the present invention to provide a DC balanced single bit manipulation encoding method and system for serial data streams.

It is another object of the present invention to provide a DC balanced single bit manipulation encoding method and system using a three state pulse width modulation code for serial data streams.

It is a further object of the present invention to a DC balanced single bit manipulation encoding method and system using a self clocking three state pulse width modulation code for serial data streams.

In carrying out the above objects and other objects, the present invention provides a method for encoding a serial data stream having a plurality of low and high bits. The method includes generating a pulse stream. The pulse stream includes a series of pulses each having a nominal time duration. A pulse of the pulse stream is modified to have a time duration longer than the nominal time duration to encode a transition of the data stream from a low bit to a high bit. A pulse of the pulse stream is modified to have a time duration shorter than the nominal time duration to encode a transition of the data stream from a high bit to a low bit. The time duration of a pulse of the pulse stream is maintained at the nominal time duration to encode two sequential high bits of the data stream. The time duration of a pulse of the pulse stream is maintained at the nominal time duration to encode two sequential low bits of the data stream.

In carrying out the above objects and other objects, the present invention provides a serial bus system having a serial interconnect and a plurality of elements connected in a serial loop through the serial interconnect. The system further has an encoder for encoding a serial data stream to be transferred from element to element along the serial loop. The serial data stream includes a plurality of low and high data bits. The encoder is operable to generate a pulse stream. The pulse stream includes a series of pulses each having a nominal time duration. The encoder is further operable to modify a pulse of the pulse stream to have a time duration longer than the nominal time duration to encode a transition of the data stream from a low bit to a high bit and to modify a pulse of the pulse stream to have a time duration shorter than the nominal time duration to encode a transition of the data stream from a high bit to a low bit. The encoder is further operable to maintain the time duration of a pulse of the pulse stream at the nominal time duration to encode two sequential high bits of the data stream and to maintain the time duration of a pulse of the pulse stream at the nominal time duration to encode two sequential low bits of the data stream.

The above objects and other objects, features, and advantages of the present invention are readily apparent from the following detailed description of the best mode for carrying out the present invention when taken in connection with the accompanying drawings.

BRIEF DESCRIPTION OF THE DRAWINGS

FIG. 2A illustrates a digital pulse stream having a series of digital pulses;

FIG. 2B illustrates a DC balanced single bit manipulation three state pulse width modulation code in accordance with the present invention;

FIGS. 3A and 3B illustrate an example of a digital data stream and the corresponding encoded three state pulse width modulation code;

BEST MODES FOR CARRYING OUT THE INVENTION

Figure 1:
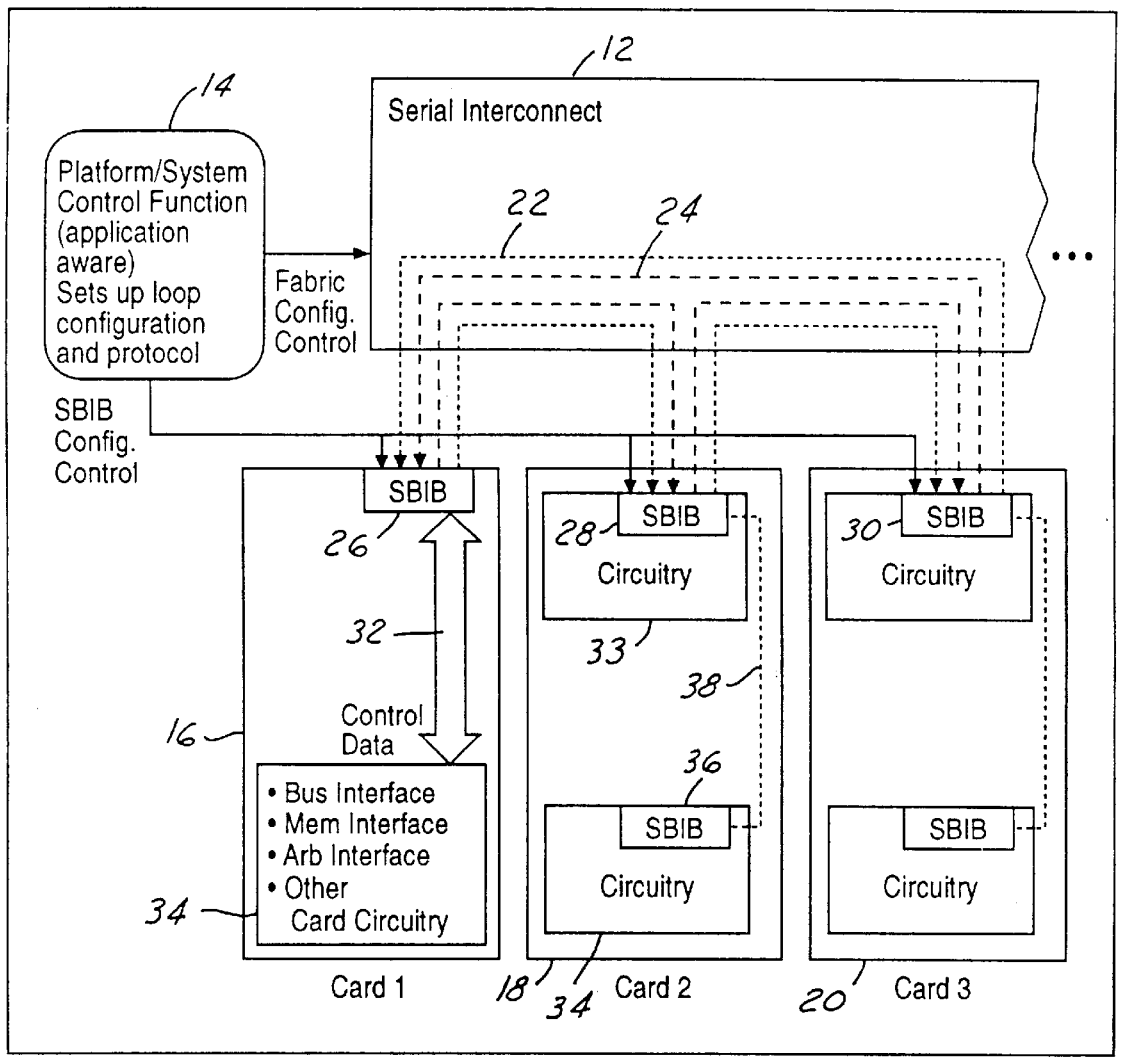
FIG. 1 illustrates a block diagram of the serial bus system in accordance with the present invention.

Referring now to FIG. 1, a serial bus system 10 in accordance with the present invention is shown. Serial bus system 10 includes a serial interconnect 12, a controller 14, and a plurality of elements or cards 16, 18, and 20. Serial interconnect 12 includes a plurality of crossbar fabrics and/or traces for making point to point serial connections. A serial bus consists of one or more loops connecting cards 16, 18, and 20. As shown in FIG. 1, a serial bus control loop 22 connects cards 16, 18, and 20. Serial bus control loop 22 is used for communicating control signals between cards 16, 18, and 20. Similarly, a serial bus data loop 24 connects cards 16, 18, and 20 for communicating data signals between the cards.

The serial bus architecture provides low latency (low hundreds to less than ten nanoseconds) control and bus like functionality that is configurable and scalable in bandwidth on an application by application basis. A serial bus is a loop or loops of circuit elements (cards/integrated circuits) that are serially connected together. The serial bus has the characteristics of low latency, variable protocol, variable functionality, and the ability to be configured. A serial bus is defined as one loop or a number of loops operating in parallel. The serial bus architecture assumes the existence of a controlling entity (e.g., controller 14) that configures the loops in protocol and topology. When multiple loops are used in parallel, they are combined to form an information transferring bus having low latency that can transfer both data and control information.

Each of cards 16, 18, and 20 includes a respective serial bus interface block (SBIB) 26, 28, and 30. SBIBs 26, 28, and 30 connect cards 16, 18, and 20 to serial interconnect 12. SBIBs 26, 28, and 30 interface a bus, memory structure, or other circuitry to serial interfaces which are connected together with serial interconnect 12. For instance, in card 16, SBIB 26 is a component that converts some form of parallel bus 32 connected to card circuitry 34 into a serial stream that can be extended via the fabric in serial interconnect 12.

Cards 18 and 20 use the serial bus for extensibility but they also have respective SBIBs 28 and 30 integrated into components within each card. For instance, SBIB 28 of card 18 is integrated within circuitry 33 typically interconnected with a parallel bus. Card 18 further includes other circuitry 34 typically interconnected with a parallel bus. Circuitry 34 includes a SBIB 36. SBIBs 28 and SBIB 36 communicate using at least one serial bus 38. Serial bus 38 interconnects circuitry 33 and 34 and replaces the standard shared parallel bus such as parallel bus 32 in card 16 resulting in lower pin count, complexity, design time, and cost.

Controller 14 is operable with serial interconnect for providing fabric configuration control. Controller 14 is also operable with SBIBs 26, 28, and 30 for SBIB configuration control. In general, controller 14 is a platform/system control function and sets up serial bus loop configuration and protocol.

SBIBS 26, 28, and 30 provide a means to store, observe, modify, encode, and forward the data that exists in the serial loop. SBIBs 26, 28, and 30 also provide inter-loop control functionality that allows multiple loops to be formed into one information passing bus. To construct a serial bus, controller 14 connects the SBIBs of the participating cards together through serial interconnect 12. Only those cards that participate in the application need to be put in the serial loop thereby allowing the serial loop to be as small as possible thus reducing latency. The number of loops grouped in parallel to make up the serial bus is determined by the bandwidth and latency requirements of the application.

The format and protocol of the data circulated through the serial bus must have certain characteristics to allow performance requirements to be met. First, for low latency, the data structure circulated through the serial loop must be as small as possible. The ability of the structure to change size dynamically supports this goal. Second, having the flexibility to configure this structure based upon application need is also a requirement to support a wide range of applications. These characteristics are not represented in any other current transmission standard such as fibre channel arbitrated loop.

Such standards do not provide these characteristics because, unlike serial bus system 10, they were not intended or designed for extremely low latency, intra-system communication.

The serial bus architecture in accordance with the present invention allows a system not constrained in functionality and performance to be built because of the design choices made at the inception of the system. The needs of the applications drive the definition and construction of sub-systems with suitable performance characteristics. The sub-systems created for the different applications are not required to physically interact with one another thereby allowing the system to be scaled and modified as needed. When the serial bus architecture is considered for inter-card communication to replace parallel buses it can significantly reduce pin count, routing complexity, and potentially part count. All of this results in lower card cost and higher reliability. The performance, scalability, and functionality of the serial bus architecture enables the conception and implementation of platforms with greatly extended applicability and life span.

Referring now to FIGS. 2A and 2B, the DC balanced single bit manipulation encoding method using a three state pulse width modulation code in accordance with the present invention will now be described. FIG. 2A illustrates a digital pulse stream 50 having a series of digital pulses 52. Digital pulses 52 oscillate between a high value (H) bit and a low value (L) bit. Each digital pulse 52 includes a rising edge 54 and a falling edge 56. A rising edge 54 is a transition of a digital pulse 52 from a low value to a high value. A falling edge 56 is a transition of a digital pulse 52 from a high value to a low value.

Digital pulse stream 50 preferably has a duty cycle of 50%. This means that a digital pulse 52 is at the high value for the same duration of time as it as at the low value. For instance, a cycle is equal to 1 nanosecond and digital pulse 52 is at the high value for ½ nanosecond and is at the low value for ½ nanosecond.

In general, digital pulse 52 is at the high value for a given duration of time and is at the low value for a given duration of time. Each of digital pulses 52 of digital pulse stream 50 has a nominal or equal time duration at the high value. Thus each of digital pulses 52 has an equal width (W) at the high value. Each of digital pulses 52 has a nominal or equal time duration at the low value. Thus each of digital pulses 52 has an equal width (W') at the low value.

FIG. 2B illustrates a DC balanced single bit manipulation three state pulse width modulation code 60 in accordance with the present invention. Modulation code 60 is used to encode a digital data stream. A digital data stream consists of a series of high and low bits. Modulation code 60 is generated by modifying digital pulse stream 50 as a function of the digital data stream. Modulation code 60 includes three different pulses or symbols for encoding the high and low bits of the digital data stream.

A positive transition of the digital data stream from a low bit to a high bit is encoded by a plus pulse 62. A plus pulse 62 is a digital pulse having a time duration at the high value longer than the nominal time duration. A negative transition of the digital data stream from a high bit to a low bit is encoded by a minus pulse 64. A minus pulse 64 is a digital pulse having a time duration shorter than the nominal time duration. The lack of a transition of the digital data stream between two bits is encoded by a neutral pulse 66. A neutral pulse 66 is a digital pulse having a time duration equal to the nominal time duration. The lack of a transition of the digital data stream may be between two high bits or between two low bits.

Referring now to FIGS. 3A and 3B, an example of a digital data stream 70 and the corresponding encoded three state pulse width modulation code 80 is shown. Digital data stream 70 includes four data bits. Data bits #1, #3, and #4 are high and data bit #2 is low. A high to low transition 72 is between high data bit #1 and low data bit #2. A low to high transition 74 is between low data bit #2 and high data bit #3. There is no transition between data bits #3 and #4.

Three state pulse width modulation code 80 includes a neutral pulse 82 and 88, a minus pulse 84, and a plus pulse 86. Neutral pulse 82 encodes the lack of a transition between high data bit #1 and a previous high data bit. Neutral pulse 82 has the same width (or time duration) as the width of a pulse of the digital pulse stream 50. Minus pulse 84 encodes the high to low transition 72 between high data bit #1 and low data bit #2. Minus pulse 84 has a narrower width (shorter time duration) than a width of a pulse of digital pulse stream 50. Plus pulse 86 encodes the low to high transition 74 between low data bit #2 and high data bit #3. Plus pulse 86 has a wider width (longer time duration) than a width of a pulse of digital pulse stream 50. Neutral pulse 88 encodes the lack of a transition between high data bits #3 and #4.

Because all digital data bit streams have as many positive transitions as negative transitions (within one) the resulting three state pulse width modulation code waveform contains as many plus pulses as negative pulses. The plus and minus pulses represent equal and opposite DC components, respectively. Over time the plus and minus pulses cancel one another out leaving the three state pulse width modulation code waveform DC balanced.

Of course, a plus pulse 62 can encode a negative transition of the digital data stream from a high bit to a low bit. Similarly, a minus pulse 64 can encode a positive transition of the digital data stream from a low bit to a high bit.

Figure 4:
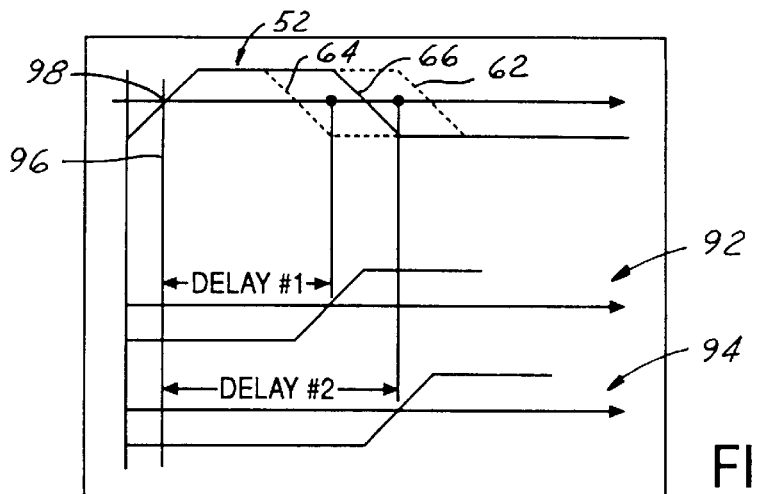
FIG. 4 illustrates the self clocking benefits of the three state pulse width modulation code in accordance with the present invention.

Referring now to FIG. 4, the self clocking benefits of the three state pulse width modulation code waveform will now be described. Self clocking means that the rising (or falling) edge of a waveform can be used to sample the waveform to determine which of the three pulses or symbols has occurred. FIG. 4 illustrates a pulse 52 of a three state pulse width modulation code waveform. A reference time line 96 is defined from the mid amplitude value point 98 of the rising edge of pulse 52 between the high and low values of pulse 52. A delay #1 from reference time line 96 to the rising edge of waveform 92 indicates that in the encoded digital data stream there is a lack of a transition between two consecutive data bits. That is, the two consecutive data bits are either both high or low. A delay #2 from reference time line 96 to the rising edge waveform 94 indicates that in the encoded digital data stream there is a transition from a low data bit to a high data bit.

Self clocking has the following benefits. First, data recovery is extremely easy to implement. Second, the clock is embedded in the pulse stream signal so clock recovery is not required. This means no phase locked loops (PLLs), filters, or any other circuitry typically associated with clock recovery. Third, because the edge of the digital pulse stream occurring previous to a data edge is used to sample the data represented by the falling edge, the only jitter of concern must occur within a nanosecond of that transition. Many of the jitter issues associated with PLLs are avoided. Fourth, because the data and its corresponding clock are related over a very small period of time (most likely less than a nanosecond) there is no lock up time associated with the data stream. Crossbar systems that use the DC balanced single bit manipulation code in accordance with the present invention can switch data paths and only have to wait nanoseconds (the crossbar switching time) instead of hundreds or thousands of nanoseconds (typical for PLLs in receivers) for data to become valid.

Figure 5:
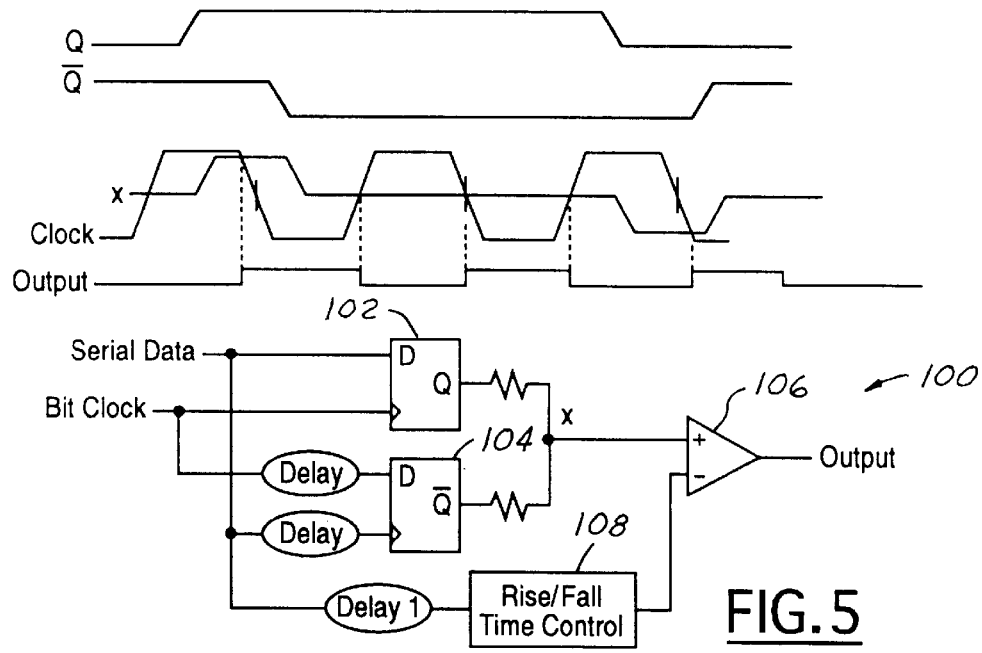
FIG. 5 illustrates an electrical circuit for producing the three state pulse width modulation code.

FIG. 5 illustrates an electrical circuit 100 for producing the three state pulse width modulation code. Electrical circuit 100 includes two flip flops 102 and 104. Flip flop 104 is clocked later because of the delay in the clock line. The output of flip flop 104 is then combined with the output of flip flop 102 resulting in a three state waveform "X". There are at least two ways to combine signals with a comparator 106 to generate a phase modulated signal. Electrical circuit 100 uses the "X" to trip comparator 106 at different voltages on the rising edge of the clock waveform using a rise/fall time control 108. In this circumstance, the rise time of the clock waveform determines how much modulation occurs.

Figure 6:
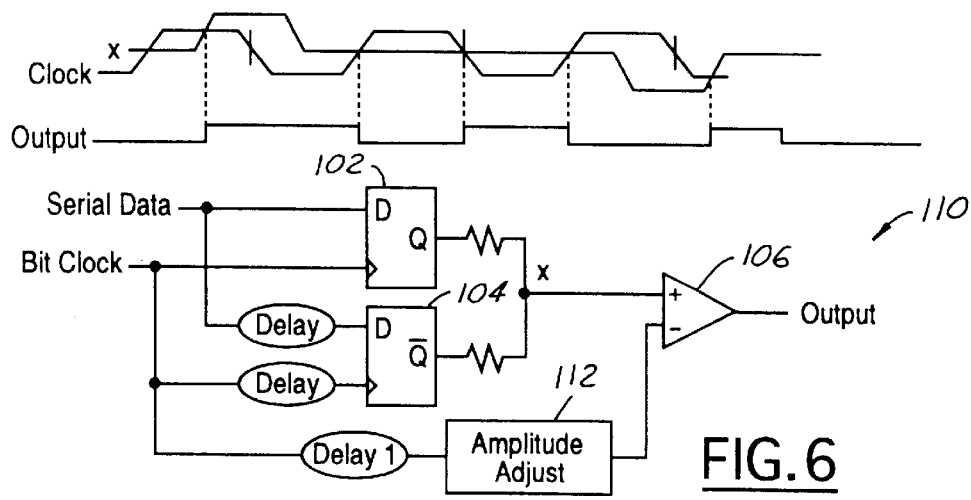
FIG. 6 illustrates another electrical circuit for producing the three state pulse width modulation code.

FIG. 6 illustrates another electrical circuit 110 having an amplitude adjust 112 for producing the three state pulse width modulation code and represents the second way to combine signals with a comparator 106 to generate a phase modulated signal. The second way to combine these signals requires that "X" be larger in amplitude than the clock signal. The resulting waveform has a larger modulation range.

The DC balanced single bit manipulation encoding method and system of the present invention enables systems to arbitrate for resources extremely quickly. The self clocking nature of the DC balanced single bit manipulation code in accordance with the present invention makes it suitable for applications unrelated to a serial bus. Such applications include serial interconnect systems having near zero lock-time requirements. Other applications include those applications unrelated to serial bus and serial interconnect systems and generally employing chips, cards, and systems.

Thus it is apparent that there has been provided, in accordance with the present invention, a DC balanced single bit manipulation encoding method and system for serial data streams that fully satisfy the objects, aims, and advantages set forth above. While the present invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A method for encoding a serial data stream having a plurality of low and high bits, the method comprising:

generating a pulse stream, the pulse stream including a series of pulses each having a nominal time duration;

modifying a pulse of the pulse stream to have a time duration longer than the nominal time duration to encode a transition of the data stream from a low bit to a high bit;

modifying a pulse of the pulse stream to have a time duration shorter than the nominal width to encode a transition of the data stream from a high bit to a low bit; and maintaining the time duration of a pulse of the pulse stream at the nominal time duration to encode two sequential high bits of the data stream.

2. A method for encoding a serial data stream having a plurality of low and high bits, the method comprising:

generating a pulse stream, the pulse stream including a series of pulses each having a nominal time duration;

modifying a pulse of the pulse stream to have a time duration longer than the nominal time duration to encode a transition of the data stream from a low bit to a high bit;

modifying a pulse of the pulse stream to have a time duration shorter than the nominal width to encode a transition of the data stream from a high bit to a low bit; and maintaining the time duration of a pulse of the pulse stream at the nominal time duration to encode two sequential low bits of the data stream.

3. A method for encoding a serial data stream having a plurality of low and high bits, the method comprising:

generating a pulse stream, the pulse stream including a series of pulses each having a nominal time duration;

modifying a pulse of the pulse stream to have a time duration longer than the nominal time duration to encode a transition of the data stream from a low bit to a high bit;

modifying a pulse of the pulse stream to have a time duration shorter than the nominal time duration to encode a transition of the data stream from a high bit to a low bit;

maintaining the time duration of a pulse of the pulse stream at the nominal time duration to encode two sequential high bits of the data stream; and maintaining the time duration of a pulse of the pulse stream at the nominal time duration to encode two sequential low bits of the data stream.

4. A serial bus system comprising:

a serial interconnect;

a plurality of elements connected in a serial loop through the serial interconnect; and an encoder for encoding a serial data stream to be transferred from element to element along the serial loop, the serial data stream including a plurality of low and high data bits, the encoder operable to generate a pulse stream, the pulse stream including a series of pulses each having a nominal time duration, the encoder further operable to modify a pulse of the pulse stream to have a time duration longer than the nominal time duration to encode a transition of the data stream from a low bit to a high bit and to modify a pulse of the pulse stream to have a time duration shorter than the nominal time duration to encode a transition of the data stream from a high bit to a low bit;

wherein the encoder is further operable to maintain the time duration of a pulse of the pulse stream at the nominal time duration to encode two sequential high bits of the data stream.

5. The system of claim 4 wherein:

the encoder includes a circuit having a pair of flip flops for generating a three state amplitude modulated signal based on the modified pulse stream.

6. The system of claim 5 wherein:

the encoder is operable for combining the three state amplitude modulated signal with a clock signal to produce a three state phase modulated signal.

7. A serial bus system comprising:

a serial interconnect;

a plurality of elements connected in a serial loop through the serial interconnect; and an encoder for encoding a serial data stream to be transferred from element to element along the serial loop, the serial data stream including a plurality of low and high data bits, the encoder operable to generate a pulse stream, the pulse stream including a series of pulses each having a nominal time duration, the encoder further operable to modify a pulse of the pulse stream to have a time duration longer than the nominal time duration to encode a transition of the data stream from a low bit to a high bit and to modify a pulse of the pulse stream to have a time duration shorter than the nominal time duration to encode a transition of the data stream from a high bit to a low bit;

wherein the encoder is further operable to maintain the time duration of a pulse of the pulse stream at the nominal time duration to encode two sequential low bits of the data stream.

8. The system of claim 7 wherein:

the encoder includes a circuit having a pair of flip flops for generating a three state amplitude modulated signal based on the modified pulse stream.

9. The system of claim 8 wherein:

the encoder is operable for combining the three state amplitude modulated signal with a clock signal to produce a three state phase modulated signal.

10. A system for encoding a serial data stream having a plurality of low and high bits, the encoded serial data stream to be transmitted between serially connected elements, the system comprising:

an encoder operable to generate a digital pulse stream, the digital pulse stream including a series of digital pulses each having a nominal time duration, the encoder further operable to modify a digital pulse of the digital pulse stream to have a time duration longer than the nominal time duration to encode a transition of the serial data stream from a low bit to a high bit, to modify a pulse of the digital pulse stream to have a time duration shorter than the nominal time duration to encode a transition of the serial data stream from a high bit to a low bit, to maintain the time duration of a digital pulse of the digital pulse stream at the nominal time duration to encode two sequential high bits of the data streams and to maintain the time duration of a digital pulse of the digital pulse stream at the nominal time duration to encode two sequential low bits of the data stream.

* * * * *